US007633597B2

(12) United States Patent
Namba et al.

(10) Patent No.: US 7,633,597 B2
(45) Date of Patent: Dec. 15, 2009

(54) EXPOSURE METHOD AND APPARATUS, AND DEVICE MANUFACTURING METHOD

(75) Inventors: Hisashi Namba, Utsunomiya (JP); Tatsuya Hayashi, Utsunomiya (JP); Takashi Kamono, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 324 days.

(21) Appl. No.: 11/695,831

(22) Filed: Apr. 3, 2007

(65) Prior Publication Data

US 2007/0236673 A1    Oct. 11, 2007

(30) Foreign Application Priority Data

Apr. 5, 2006    (JP)    ............... 2006-104443

(51) Int. Cl.
*G03B 27/52* (2006.01)
*G03B 27/42* (2006.01)
(52) U.S. Cl. .......................................... 355/30; 355/53
(58) Field of Classification Search ................. 355/30, 355/52, 53, 55, 67; 250/548; 356/399–401
See application file for complete search history.

(56) References Cited

U.S. PATENT DOCUMENTS

| | | | | |
|---|---|---|---|---|
| 4,690,528 A | * | 9/1987 | Tanimoto et al. ............ 353/101 |
| 4,704,348 A | * | 11/1987 | Koizumi et al. ............. 430/327 |
| 6,198,792 B1 | | 3/2001 | Kanouff et al. |
| 6,714,277 B2 | * | 3/2004 | Hara et al. .................... 355/30 |
| 6,842,221 B1 | * | 1/2005 | Shiraishi ....................... 355/30 |
| 6,864,953 B2 | * | 3/2005 | Uzawa ........................ 355/53 |
| 7,317,505 B2 | * | 1/2008 | Aichi et al. ................... 355/30 |
| 7,330,236 B2 | | 2/2008 | Hasegawa |

FOREIGN PATENT DOCUMENTS

| | | |
|---|---|---|
| JP | 2002-529927 | 9/2002 |
| JP | 2005-101537 A | 4/2005 |
| WO | 2006/012462 A1 | 2/2006 |

* cited by examiner

*Primary Examiner*—Hung Henry Nguyen
(74) *Attorney, Agent, or Firm*—Rossi, Kimms & McDowell LLP (57) ABSTRACT

An exposure apparatus includes an illumination optical system configured to illuminate a reticle using extreme ultraviolet light, a projection optical system configured to project a pattern of the reticle onto a substrate, a diaphragm that defines a first space that accommodates the projection optical system, a first gas supplier configured to supply a first gas to the first space, and a first cooling unit configured to cool the first gas before the first gas supplier supplies the first gas to the first space.

11 Claims, 5 Drawing Sheets

EXPOSURE METHOD AND APPARATUS, AND DEVICE MANUFACTURING METHOD

BACKGROUND OF THE INVENTION

1. Field of the Invention

The present invention relates to an exposure apparatus and method.

2. Description of the Related Art

A conventional projection exposure apparatus projects a circuit pattern of a reticle (mask) onto a wafer or another substrate via a projection optical system in manufacturing fine semiconductor devices, such as a semiconductor memory and a logic circuit, using the photolithography technology.

The minimum critical dimension or a resolution transferable by the projection exposure apparatus is proportionate to a wavelength of the light used for exposure, and inversely proportionate to the NA of the projection optical system. The shorter the wavelength is, the smaller the resolution is. Along with the recent demands for fine processing to a semiconductor device, use of a shorter wavelength of the exposure light is promoted, such as a ultra-pressure mercury lamp (such as an i-line with a wavelength of about 365 nm), a KrF excimer laser with a wavelength of about 248 nm, and an ArF excimer laser with a wavelength of about 193 nm.

However, a semiconductor device becomes rapidly finer, the lithography using the ultraviolet ("UV") light has a limit. Accordingly, an exposure apparatus that uses the extreme ultraviolet ("EUV") light having a wavelength of about 10 nm to about 15 nm smaller than the wavelength of the UV light, which is referred to as an EUV exposure apparatus, is being developed.

Since the energy attenuation in gasses is very high in the wavelength range of the EUV light, the optical system of the EUV exposure apparatus is arranged in a vacuum atmosphere. Photochemical reactions between oxygen in air and impurities cause contaminations, such as hydrocarbons, to optical elements, and thus the partial pressure of the hydrocarbon in the EUV exposure apparatus needs to be made small. In particular, a space that accommodates the projection optical system, which is referred to as a "projection optical system space ("POSS")" hereinafter, needs to maintain very low partial pressure of the hydrocarbon.

On the other hand, in order to prevent inflows of the hydrocarbons into the POSS, Japanese Domestic Publication No. 2002-529927 proposes a EUV exposure apparatus that isolates the POSS from the surrounding space, such as a space that accommodates the stage. This EUV exposure apparatus maintains the pressure in the POSS higher than the surrounding pressure, preventing the inflows of the hydrocarbons from the stage space.

In order to maintain the pressure in the POSS higher than the surrounding pressure, a gas needs to be supplied to the POSS. Conceivably, the gas is supplied from the outside of the apparatus through a pipe and a nozzle.

Although it is generally conceivable that the temperature of the gas introduced from an air pressure space to the vacuum space drops due to the adiabatic expansion, it is confirmed from a simulation that when the gas is supplied into the POSS, the supplied gas's temperature rises. When the gas is supplied from the air pressure state to the POSS below 100 Pa, the gas flows in the POSS at a significant speed even with an orifice and a stop. Thereby, the supplied gas's temperature conceivably rises.

The POSS is exhausted at a constant speed. A certain amount of gas is also supplied through the pipe and nozzle. After a certain time period elapses, the gas flow reaches an equilibrium state. When a one-dimensional phenomenon is assumed for a simple description, Equation 1 below expresses the energy conservation law in the steady adiabatic flow, where h is entropy, Cp is specific heat, T is absolute temperature, and u is a gas speed.

$$h + \tfrac{1}{2} \times u2 = \text{const} \qquad \text{Equation 1}$$

Equation 2 below expresses a relationship between the entropy and the specific heat.

$$h = Cp \times T \qquad \text{Equation 2}$$

Equation 3 below defines a relationship between the gas's temperature and speed from Equations 1 and 2:

$$T1 + u^2/(2Cp) = \text{const} \qquad \text{Equation 3}$$

Equation 3 indicates that the temperature rises as the speed lowers where the gas that has a high speed in the pipe is supplied to the POSS. When the gas whose temperature has risen flows in the POSS, a mirror position fluctuates due to the temperature rise of the optical element and the thermal expansion of a holder (structural member), degrading the pattern transfer precision.

In addition, the temperature of the supplied gas rises as the gas is supplied to the load lock chamber so as to convert its internal pressure to the air pressure. The load lock chamber is configured to feed a wafer to the exposure apparatus that is maintained in the vacuum state.

It is assumed that P denotes pressure, T denotes temperature, γ denotes a ratio of specific heat, T0(° C.) is the reference temperature of the POSS, 1 denotes an initial state in the chamber (at a low pressure state), 2 denotes a state after the gas is supplied to the chamber, and the kinetic energy of the inflow gas is assumed to be smaller than the gas's enthalpy. Then, a relationship indicated by Equation 4 below is established:

$$T2 = \gamma \times P2 \times T1 \times T0 / ((P2 - P1) \times T1 + \gamma \times P1 \times T0) \qquad \text{Equation 4}$$

For example, when T0=T1=296K, P2=0.1 MPa, P1=100 Pa, γ=1.4, the temperature in the gas becomes 414 K in the apparatus. This result is derived from a calculation under various assumptions, but it is known that the temperature rises in the actual experiment.

When the temperature rises in opening the load lock chamber to the air pressure, the wafer is fed while the temperature of the load lock chamber is high, and it takes a long time to stabilize the temperature of the wafer to the reference temperature.

BRIEF SUMMARY OF THE INVENTION

The present invention is directed to an exposure apparatus that provides a superior exposure characteristic, such as a transfer accuracy and throughput, even when the temperature of the gas supplied in the exposure apparatus rises.

An exposure apparatus according to one aspect of the present invention includes an illumination optical system configured to illuminate a reticle using extreme ultraviolet light, a projection optical system configured to project a pattern of the reticle onto a substrate, a diaphragm that defines a first space that accommodates the projection optical system, a first gas supplier configured to supply a first gas to the first space, and a first cooling unit configured to cool the first gas before the first gas supplier supplies the first gas to the first space.

A further object and other characteristics of the present invention will be made clear by the preferred embodiments described below referring to accompanying drawings.

DESCRIPTION OF THE EMBODIMENTS

Referring now to the accompanying drawings, a description will be given of an exposure apparatus according to one aspect of the present invention. In each figure, the same reference numeral designates the same element, and a duplicate description thereof will be omitted. Here, FIG. 1 is a schematic sectional view showing a structure of an exposure apparatus 1 of this embodiment.

The exposure apparatus 1 is a projection exposure apparatus that exposes a circuit pattern of a reticle 20 onto a substrate 40 using the EUV light EL with a wavelength, for example, of about 13.4 nm as the exposure light. The exposure apparatus 1 of this embodiment is a step-and-scan projection exposure apparatus. However, the exposure apparatus 1 can use a step-and-repeat manner and another type of exposure method.

Figure 1:
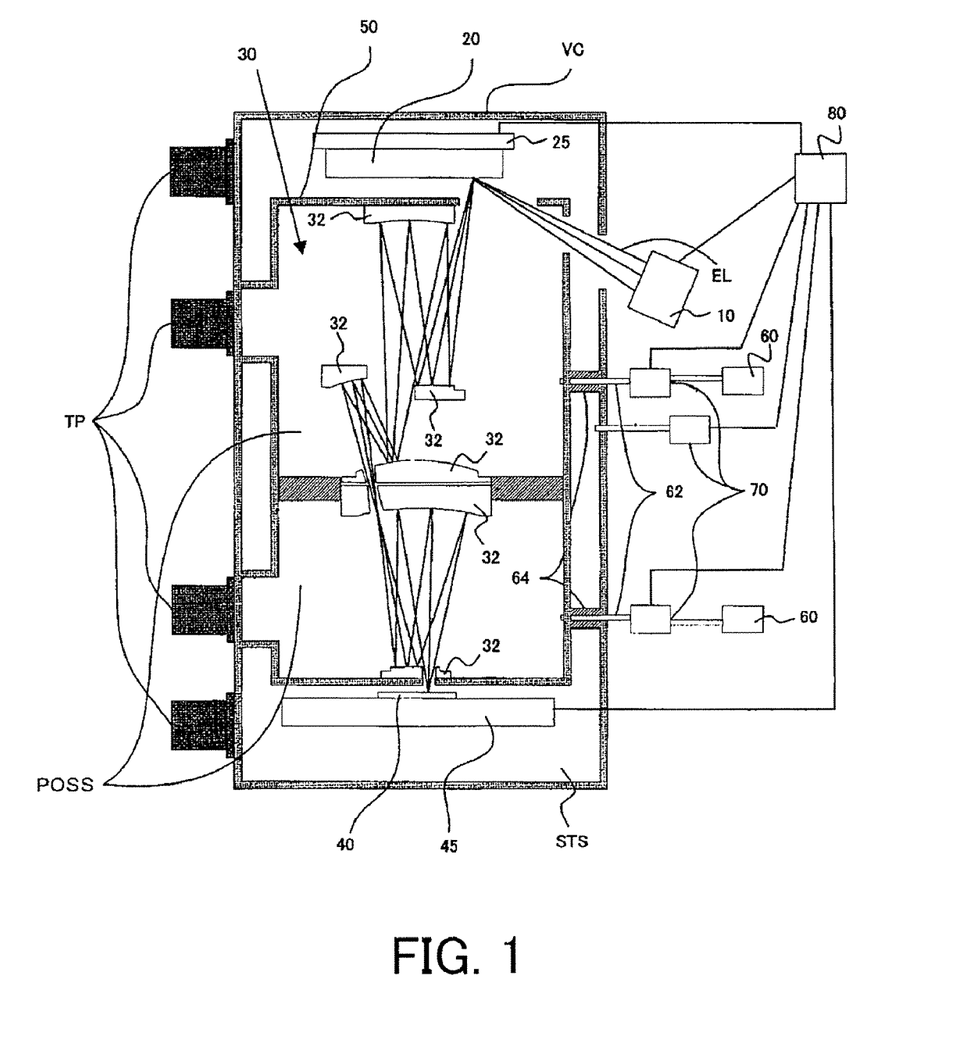
FIG. 1 is a schematic sectional view showing a structure of an exposure apparatus according to one aspect of the present invention.

The exposure apparatus 1 includes, as shown in FIG. 1, an illumination apparatus 10, a reticle stage 25 mounted with a reticle 20, a projection optical system 30, a wafer stage 45 mounted with a substrate 40, a diaphragm 50, a gas supplier 60, a gas cooler 70, and a controller 80.

The exposure apparatus 1 has a vacuum chamber VC so as to maintain, as shown in FIG. 1, at least an optical path of the EUV light EL in a vacuum or reduced pressure environment. The vacuum chamber VC is provided with a turbo-molecular pump TP, which exhausts the inside of the vacuum chamber VC. This is because the transmittance of the EUV light EL to air is low, and a contamination occurs due to a reaction with a residue gas component, such as a polymer organic gas. The vacuum chamber VC serves as an exposure apparatus that exposes the pattern of the reticle 20 onto the substrate 40 via the projection optical system 30.

The illumination apparatus 10 is an illumination apparatus that illuminates the reticle 20 using the arc-shaped EUV light EL corresponding to the arc field of the projection optical system 30. The illumination apparatus 10 includes a EUV light source (not shown), and an illumination optical system (not shown). The EUV light source uses a laser plasma light source, but may use a discharge plasma light source, or any structure known in the art. The illumination optical system is an optical system that illuminates the reticle 20, and includes a condenser mirror, an optical integrator, and an aperture.

The reticle 20 is a reflection reticle that has a mirror on which a pattern or image to be transferred is formed. The reticle 20 is supported on and driven by the reticle stage 25.

The reticle stage 25 supports the reticle 20, and is connected to a moving mechanism (not shown). The exposure apparatus 1 scans while synchronizing the reticle 20 with the substrate 40.

The projection optical system 30 projects a reduced image of a pattern of the reticle 20 onto the substrate 40 on the image plane using plural multilayer mirrors 32. The projection optical system 30 has four to six mirrors 32. In order to realize a wide exposure area with the small number of mirrors, a wide area is transferred by simultaneously scanning the reticle 20 and the substrate 40 using a ring field or a thin arc area apart from the optical axis by a certain distance. The projection optical system has a numerical aperture ("NA") between 0.2 and 0.3.

The substrate 40 is a wafer in this embodiment, but broadly covers a glass plate and another substrate. A photoresist is applied to the surface of the wafer 40.

The wafer stage 45 supports the substrate 40 via a wafer chuck (not shown). A position of the reticle stage 25 and a position of the wafer stage 45 are monitored, for example, by a laser interferometer, and both are driven at a constant speed ratio.

The diaphragm 50 defines a POSS (first space) that accommodates the projection optical system 30. In other words, the diaphragm 50 encloses the projection optical system 30, and isolates the POSS from the stage space (second substrate) that accommodates the reticle 20 and the substrate 40. The POSS and the stage space STS are maintained at the reference temperature. Here, the reference temperature is the temperature that does not affect or deform optical elements accommodated in the POSS and the stage space STS (or does not lower the exposure characteristic in the exposure apparatus 1).

The gas supplier 60 supplies the gas, such as inert gas (e.g., nitrogen) to the POSS via the supply pipe 62. Thereby, the pressure in the POSS can be maintained higher than that in the stage space STS, reducing or preventing the inflows of the hydrocarbons from the stage space STS. This embodiment maintains the POSS at about several Pa, and the stage space STS at about $10^{-4}$ Pa.

The turbo-molecular pump TP exhausts the POSS at a constant speed. A supply pipe 62 supplies a constant amount of gas from the gas supplier 60 to the POSS. As the gas flow reaches the equilibrium state after a certain time period, as discussed above, the relationships indicated by Equations 1 to 3 are established. The gas supplied via the supply pipe 62 to the POSS reduces its speed in the POSS, and its temperature rises. In other words, the temperature of the supplied gas rises due to a difference between the gas speed in the supply pipe 62 and the gas speed in the POSS near the supply port of the supply pipe 62.

Accordingly, the exposure apparatus 1 of this embodiment includes a gas cooler 70, and prevents the temperature of the POSS from being higher than the reference temperature when the temperature of the gas supplied to the POSS rises. The gas cooler 70 previously cools the gas supplied to the POSS from the gas supplier 60. The gas cooler 70 includes, for example, a Peltier element and a compressor. The gas cooler 70 that includes a Peltier element can controls or cools, at a unit of $\frac{1}{100}$ (° C.), the temperature of the gas supplied by the gas supplier 60. This embodiment also provides another gas cooler 70 between a gas supplier (not shown) that supplies the gas to the stage space STS and the stage space STS, and cools the gas supplied to the stage space STS.

The controller 80 includes a CPU (not shown), and a memory, and controls an operation of the exposure apparatus 1. The controller 80 is connected controllably to the illumination apparatus 10, the reticle stage 25, the wafer stage 45, and the gas cooler 70. The CPU controls each component. The memory stores firmware that operates the exposure apparatus 1.

The controller 80 of this embodiment controls the temperature of the gas supplied to the POSS. More specifically, the controller 80 controls the temperature of the gas supplied to the POSS based on the reference temperature of the POSS, the pipe diameter of the supply pipe 62, and the gas amount supplied from the gas supplier 60 to the POSS. It is known from a simulation that the gas supplied to the POSS rise by about 10° C. depending on locations. Accordingly, the controller 80 supplies the temperature of the gas supplied to the POSS by a temperature rise amount (temperature variation) via the gas cooler 70. Thereby, the gas supplied to the POSS has the approximately reference temperature in the POSS. For example, the controller 80 controls the temperature of the gas supplied to the POSS so as to satisfy Equation 5 below, where T0(° C.) is the reference temperature of the POSS, and Tg(° C.) is the temperature of the gas supplied to the POSS. In other words, the temperature of the gas supplied to the POSS has been lower than the reference temperature by 0.01 (° C.) to 10 (° C.).

$$T0-0.01(° C.) \geq Tg \geq T0-10(° C.) \quad \text{Equation 5}$$

Thus, the gas cooler 70 cools the gas to be supplied to the POSS by the temperature rise amount before the gas is supplied to the POSS, maintaining the temperature of the POSS at the reference temperature. T0−0.01 (° C.) is set because the temperature change of the optical element in the POSS is smaller than 0.01 (° C.) if the gas temperature changes by about 0.01 (° C.). For example, when the mirror holding member changes the temperature by 0.01 (° C.), a variance amount of the mirror interval is about 30 nm, which is within a correctable range.

Indeed, the temperature of the gas supplied to the POSS relates to the pressure, and does not rise as discussed above. However, from a simulation result, the temperature rises by 0.01 (° C.) when a supplied gas amount is small, and by 10 (° C.) when a supplied gas amount is large. Thus, the gas cooler 70 decreases the gas temperature by 0.01 (° C.) to 10 (° C.) in accordance with a gas supply amount.

When the cooled gas flows, the temperature of the supply pipe 62 is lower than the reference temperature, and may cool the surrounding members. Accordingly, this embodiment provides the insulator member 64 in the supply pipe 62, and prevents cooling of the surrounding member. In order to prevent cooling of the surrounding member, the supply pipe 62 includes a double pipe and the gas may be flowed in the inner pipe.

Figure 2A:
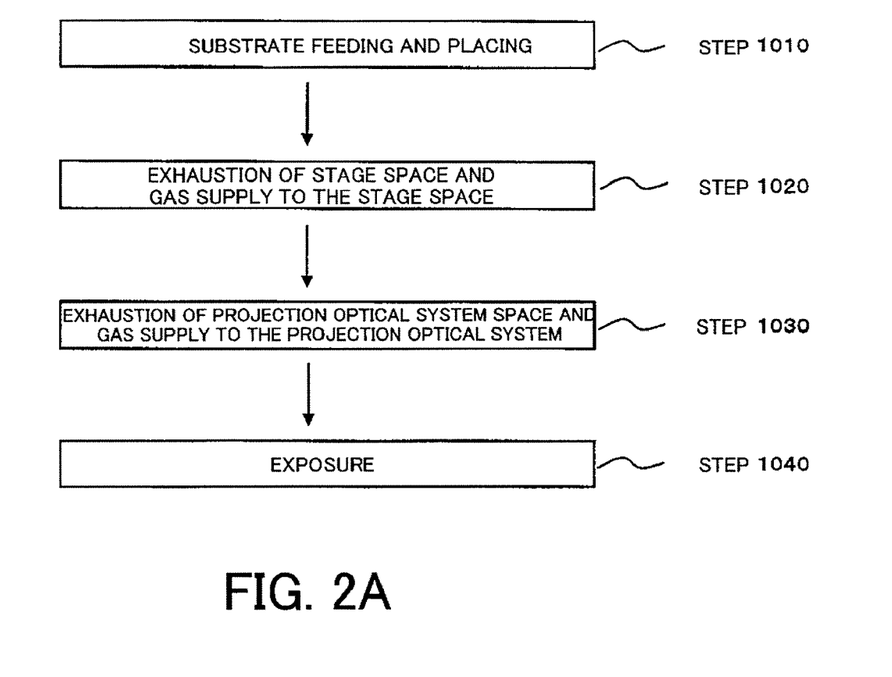
FIG. 2A is a flowchart for explaining an exposure operation or method of the exposure apparatus shown in FIG. 1.
Figure 2B:
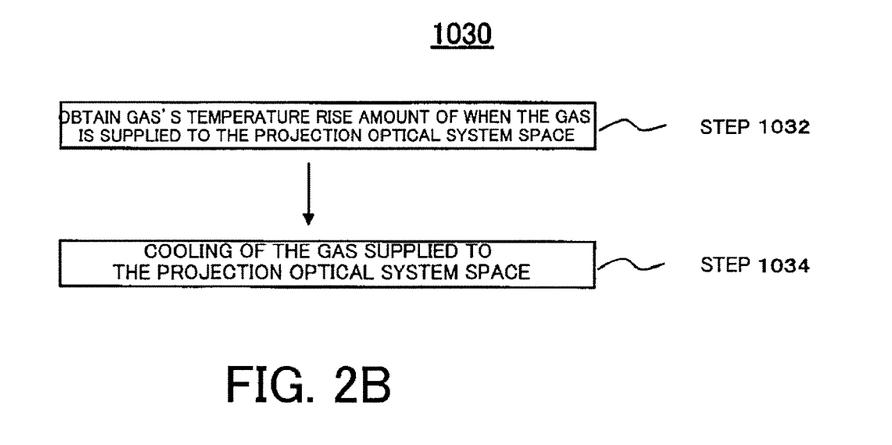
FIG. 2B is a detailed flowchart of the step 1030 in FIG. 2A.

Referring now to FIG. 2, a description will be given of an exposure operation or method of the exposure apparatus 1. FIGS. 2A and 2B are flowcharts for explaining the exposure operation of the exposure apparatus. More specifically, FIG. 2A is an entire exposure operation of the exposure apparatus 1. FIG. 2B shows the details of the step 1030 in FIG. 2A. Initially, the substrate 40 is fed to the exposure apparatus 1, and placed on the wafer stage 45 (step 1010). When the substrate 40 is placed on the wafer stage 45, the turbo-molecular pump TP exhausts the stage space STS and the gas supplier (not shown) supplies the gas to the stage space STS (step 1020). In exhausting the stage space STS, the POSS may be simultaneously exhausted.

When the gas flow in the stage space STS reaches the equilibrium state, the POSS is exhausted and the POSS is supplied with the gas from the gas supplier 60 (step 1030). In supplying the gas to the POSS, the gas cooler 70 cools the gas by the temperature rise amount. More specifically, as shown in FIG. 2A, the temperature rise amount of the gas is obtained in supplying the gas to the POSS (step 1032). The temperature rise amount of the gas may be obtained from the actual experiment or simulation. In obtaining the temperature rise amount of the gas from the simulation, as discussed above, the temperature rise amount of the gas may be calculated from the reference temperature of the POSS, the pipe diameter of the supply pipe 62, and the gas supply amount. Then, the gas to be supplied to the POSS is cooled based on or by the temperature rise amount obtained in the step 1032 (step 1034).

When the gas flow reaches the equilibrium state in the POSS, the pattern of the reticle 20 is exposed on the substrate 40 (step 1040). The pressure in the POSS is maintained higher than that of the stage space STS, preventing the inflows of the contaminations from the stage space STS to the POSS. Since the gas supplied to the POSS has been cooled as discussed above, the temperature of the POSS becomes about reference temperature, and the temperature rise inside the POSS is prevented. In other words, the gas supplied to the POSS does not affect the optical elements accommodated in the POSS, preventing a drop of the exposure characteristic of the exposure apparatus 1.

This embodiment cools the gas supplied to the POSS based on the temperature rise amount of the gas that has previously been obtained. However, the temperature of the POSS or the temperature of the gas supplied to the POSS may be measured, and the gas supplied to the POSS may be cooled by feeding back the measurement result.

In exposure, the EUV light emitted from the illumination apparatus 10 illuminates the reticle 20. The EUV light that has passed the reticle 20 and reflects the reticle pattern is imaged on the substrate 40 via the projection optical system 30. In this embodiment, the image plane is an arc or ring shaped image plane, and the entire plane of the reticle 20 is exposed by scanning the reticle 20 and the substrate 40. As discussed above, the exposure apparatus 1 realizes a superior exposure characteristic, such as a high transfer precision, and provides a higher quality device, such as a semiconductor device and a liquid crystal display device, than ever with a high throughput.

Figure 3:
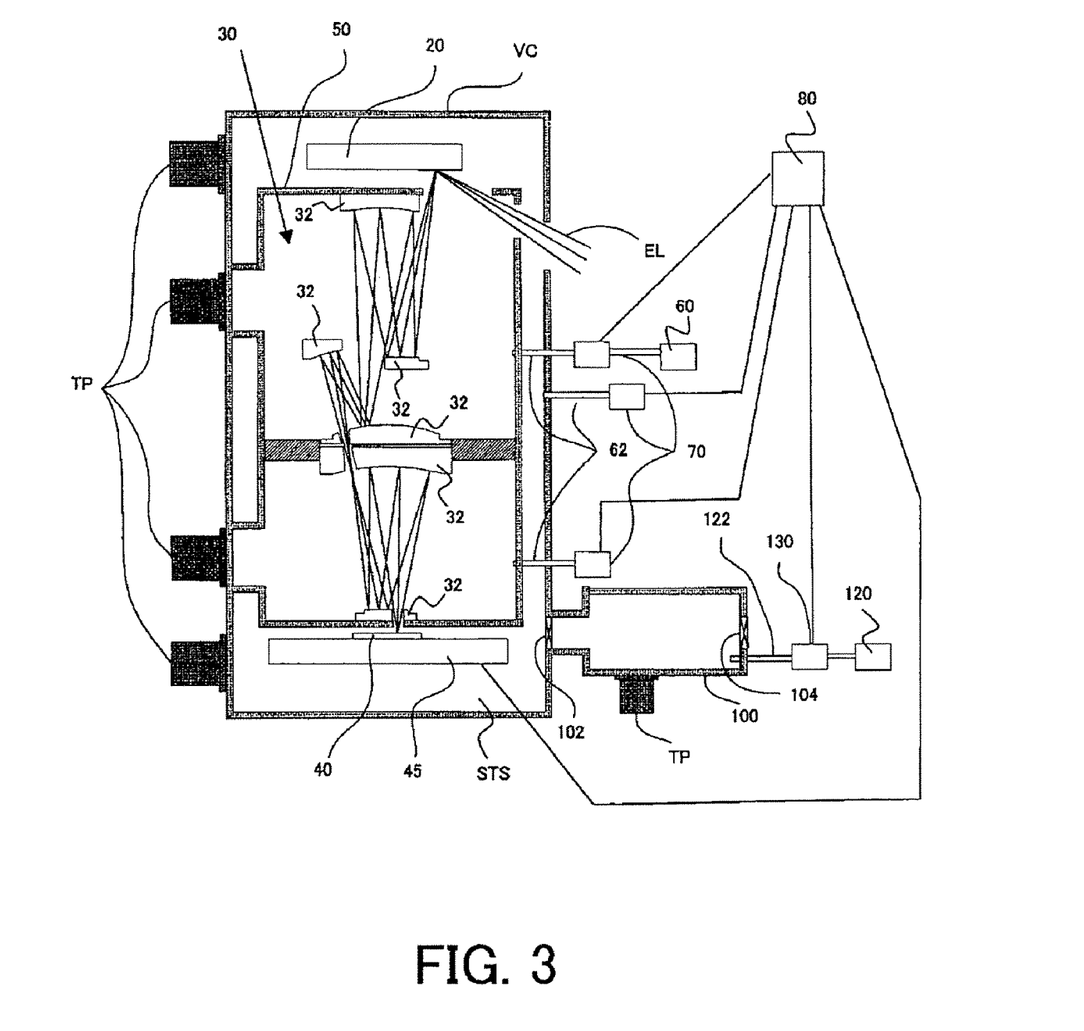
FIG. 3 is a schematic sectional view showing a modification of the exposure apparatus shown in FIG. 1.

FIG. 3 is a schematic sectional view showing a structure of an exposure apparatus 1A as a variation of the exposure apparatus 1. The exposure apparatus 1A has a similar structure to the exposure apparatus 1, and further includes a load lock chamber 100.

The load lock chamber 100 feeds the substrate 40 in the exposure apparatus 1A from the outside, and feeds out the exposed substrate 40 to the outside of the exposure apparatus 1A. The inside of the exposure apparatus 1A is maintained in the vacuum or reduced pressure environment. In an attempt to feed the substrate 40 in the vacuum chamber VC, the vacuum or reduced pressure environment of the exposure apparatus 1 would be destroyed.

Accordingly, this embodiment uses the load lock chamber 100. In feeding the substrate 40 from the outside of the exposure apparatus 1A, a gate valve 102 closes between the load lock chamber 102 and the vacuum chamber VC of the exposure apparatus 1A so as to open the load lock chamber 100 to the air pressure. Next, a gate valve 104 opens that connects the load lock chamber 100 to the outside, and the substrate 40 is fed through the gate valve 104. After the substrate 40 is fed in the load lock chamber 100, the gate valve 104 closes and the turbo-molecular pump TP exhausts the load lock chamber 100 so as to make the load lock chamber 100 vacuum. After the load lock chamber 100 becomes vacuum, the gate valve 102 opens to feed in the substrate 40 without destroying the vacuum state in the vacuum chamber VC. After the substrate 40 is fed in the vacuum chamber VC, the gate valve 102 closes and the gas supplier 120 supplies the gas to the load lock chamber 100 via the supply pipe 122. When the pressure of the load lock chamber 100 becomes the air pressure, the gate valve 104 opens and the substrate 40 is fed in the load lock chamber 100.

In supplying the gas to the load lock chamber 100 in a vacuum or reduced pressure environment and returning the pressure to the air pressure, the temperature of the gas supplied to the load lock chamber 100 rises, similar to the gas supplied to the POSS. It is assumed that P denotes the pressure, T denotes the temperature, γ denotes a ratio of specific heat, V denotes a volume of the load lock chamber 100, 1 denotes an initial state in the load lock chamber 100 (at a low pressure state), 2 denotes a state after the gas is supplied to the load lock chamber 100. When TR denotes the temperature of the gas supplied to the load lock chamber 100, the kinetic energy of the supplied gas is assumed to be smaller than the gas's enthalpy. Then, Equation 6 below is established.

$$T2 = \gamma \times P2 \times T1 \times TR / ((P2-P1) \times T1 + \gamma \times P1 \times TR) \quad \text{Equation 6}$$

Equation 6 indicates that the temperature of the gas supplied to the load lock chamber 100 rises. Equation 6 is calculated under various assumptions, but it is known from an actual experiment that the temperature of the gas supplied to the load lock chamber 100 rises.

However, as the temperature of the gas supplied to the load lock chamber 100 rises, the temperature of the member accommodated in the load lock chamber 100 rises. In feeding the substrate 40 in the load lock chamber 100 or placing the substrate 40 on the holder, the temperature of the substrate 40 becomes higher than the reference temperature and it takes a time to return the temperature to the reference temperature. Thereby, it takes a time to feed the substrate 40 from the load lock chamber 100 to the vacuum chamber VC, causing the lowered throughput.

Accordingly, this embodiment calculates a temperature rise amount of the gas supplied to the load lock chamber 100 through the experiment or simulation, uses the gas cooler 130, and supplies the gas cooled by the temperature rise amount, as discussed above. This configuration prevents the temperature of the gas supplied to the load lock chamber 100 from being higher than the reference temperature. The structure of the gas cooler 130 has a structure similar to the gas cooler 70, and a detailed description thereof will be omitted.

An amount of the gas cooled by the gas cooler 130 is determined by the pressure and the air opening time of the load lock chamber 100. It is known that the gas supplied to the load lock chamber 100 rises by about 6° C. due to the experiment and simulation. Since the gas cooler 130 can reduce the gas temperature by 0.01° C. to 10° C., the gas temperature supplied to the load lock chamber 100 can be sufficiently cooled. Thus, the temperature of the gas supplied to the load lock chamber 100 is the about reference temperature. The temperature of the load lock chamber 100 at the air pressure opening time becomes the approximately reference temperature. Thus, a time period necessary to stabilize the temperature of the substrate 40 to the reference temperature in the load lock chamber 100 becomes shorter, and a drop of the throughput can be prevented.

Figure 4:
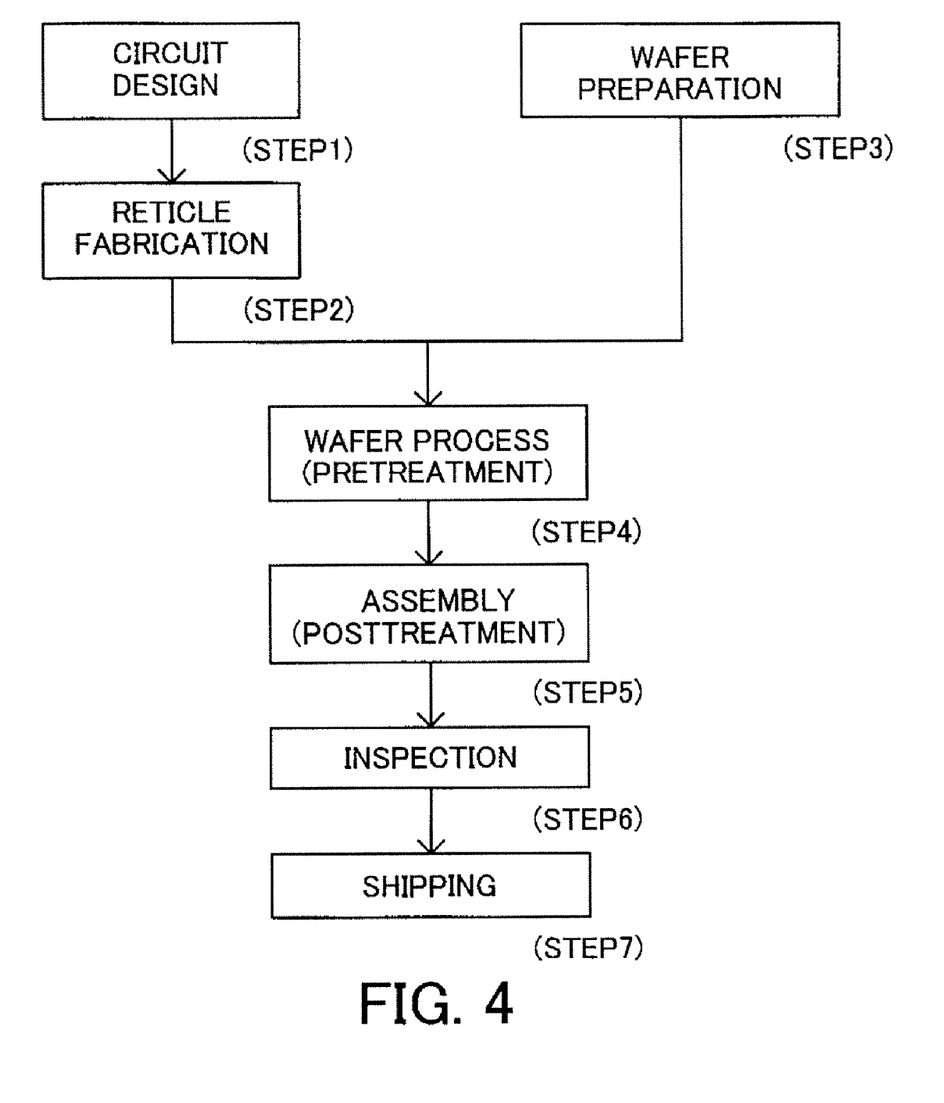
FIG. 4 is a flowchart for explaining a fabrication of a device.
Figure 5:
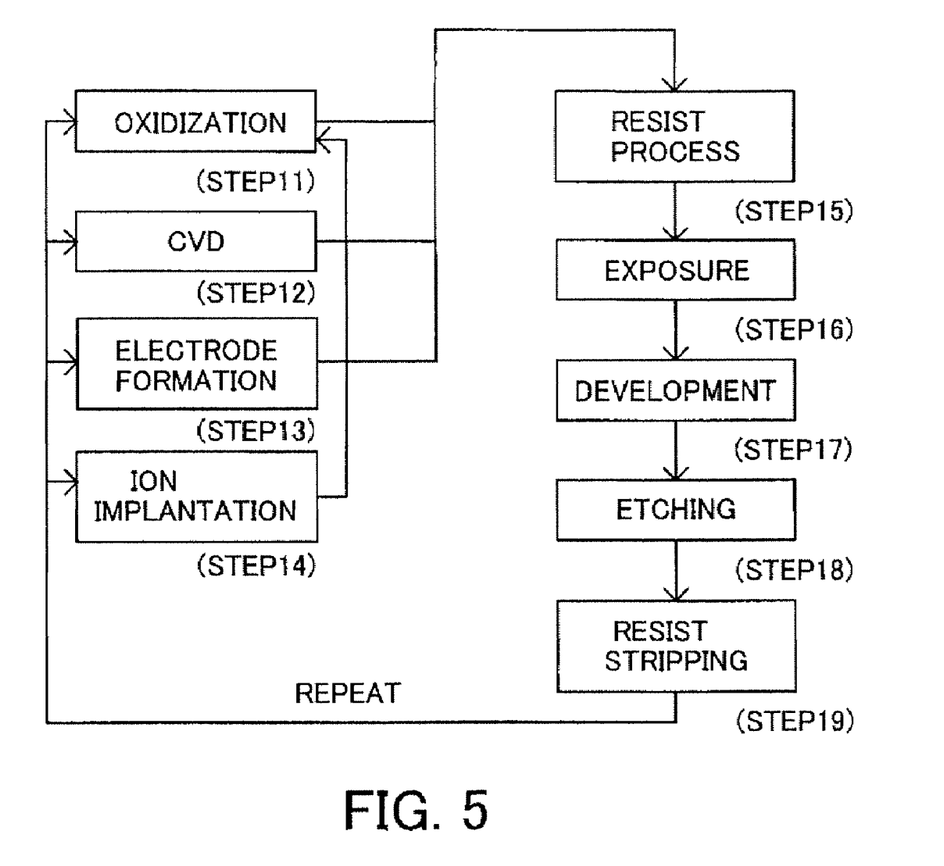
FIG. 5 is a flowchart for a wafer process of step 4 shown in FIG. 4.

Referring now to FIGS. 4 and 5, a description will be given of an embodiment of a device manufacturing method using the exposure apparatus 1 or 1A. FIG. 4 is a flowchart for explaining manufacture of devices, such as a semiconductor device and a liquid crystal display device. Here, a description will be given of the fabrication of a semiconductor device as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 5 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 1, 1A or 1B to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device manufacturing method of this embodiment may manufacture higher quality devices than ever. Thus, the device manufacturing method using the exposure apparatus 1 or 1A, and a resultant device also constitute one aspect of the present invention.

Further, the present invention is not limited to these preferred embodiments and various variations and modifications may be made without departing from the scope of the present invention.

This application claims a foreign priority benefit based on Japanese Patent Application No. 2006-104443, filed on Apr. 5, 2006, which is hereby incorporated by reference herein in its entirety as if fully set forth herein.

What is claimed is:

1. An exposure apparatus configured to illuminate a reticle with extreme ultraviolet light and expose a substrate to extreme ultraviolet light via the reticle in a vacuum, said exposure apparatus comprising:
    a projection optical system configured to project a pattern of the reticle onto the substrate with extreme ultraviolet light reflected at the reticle;
    a diaphragm that defines a first space that accommodates the projection optical system;
    a pump configured to exhaust the first space;
    a first gas supplier configured to supply an inert gas to the first space so as to maintain a pressure of the first space higher than a pressure of a second space outside the first space; and
    a first cooling unit configured to cool the inert gas so that the inert gas to be supplied to the first space has a first temperature,
    wherein the first temperature is previously determined based on a temperature rise amount of the inert gas supplied to first space from the first gas supplier, the first temperature being lower than a reference temperature at which a temperature of the first space is to be maintained.

2. An exposure apparatus according to claim 1, further comprising:
    a first supply pipe configured to connect the first space to the first gas supplier; and
    a controller configured to control a temperature of the inert gas that is provided from the first cooling unit,
    wherein the controller is configured to calculate the first temperature based on the reference temperature, a diameter of the first supply pipe, and a gas supply amount of the first gas supplier.

3. An exposure apparatus according to claim 2, wherein the controller is configured to control the temperature of the inert gas so that $T0-0.01(°C.) \geq Tg \geq T0-10(°C.)$ is met, where $T0(°C.)$ is the reference temperature, and $Tg(°C.)$ is the temperature of the inert gas.

4. An exposure apparatus according to claim 1, further comprising a reticle stage configured to hold the reticle and a substrate stage configured to hold the substrate,
wherein at least one of the reticle stage and the substrate stage is accommodated in the second space.

5. An exposure apparatus according to claim 1, further comprising:
a load lock chamber through which the substrate is fed from a third space in an atmospheric pressure to the second space;
a second gas supplier configured to supply a gas to a fourth space in the load lock chamber so that a pressure in the fourth space changes from a pressure in the second space to the atmospheric pressure; and
a second cooling unit configured to cool the gas so that the gas to be supplied to the fourth space has a second temperature,
wherein the second temperature is previously determined based on a temperature rise amount of the gas supplied to the fourth space from the gas supplier, the second temperature being lower than a reference temperature at which a temperature of the fourth space is to be maintained.

6. An exposure apparatus having a vacuum chamber, and configured to illuminate a reticle using extreme ultraviolet light and expose a substrate to extreme ultraviolet light via the reticle in the vacuum chamber, said exposure apparatus comprising:
a load lock chamber through which the substrate is fed from a first space in an atmospheric pressure to a second space in the vacuum chamber;
a gas supplier configured to supply a gas to a third space in the load lock chamber so that a pressure in the third space changes from a pressure in the vacuum chamber to the atmospheric pressure; and
a cooling unit configured to cool the gas so that the gas to be supplied to the third space has a first temperature,
wherein the first temperature is previously determined based on a temperature rise amount of the gas supplied to the third space from the gas supplier, the first temperature being lower than a reference temperature, at which a temperature of the third space is to be maintained.

7. An exposure apparatus according to claim 6, further comprising:
a supply pipe configured to connect the third space to the gas supplier; and
a controller configured to control a temperature of the gas that is provided from the cooling unit,
wherein the controller is configured to calculate the first temperature based on the reference temperature, a diameter of the supply pipe, and a gas supply amount of the gas supplier.

8. An exposure method of illuminating a reticle with extreme ultraviolet light and exposing a substrate to extreme ultraviolet light via the reticle and a projection optical system in a vacuum chamber, said exposure method comprising the steps of:
rendering a space vacuum using a pump; and
supplying an inert gas to the space using a gas supplier so as to rise a pressure of the space that is exhausted,
wherein the supplying step includes:
obtaining a temperature rise amount of the inert gas supplied to the space, that is rendered vacuum, from the gas supplier;
determining a first temperature being lower than a reference temperature at which a temperature of the space is to be maintained, based on the temperature rise amount obtained in the obtaining step, and
cooling the inert gas so that the inert gas to be supplied to the space has the first temperature.

9. An exposure method according to claim 8, wherein the obtaining step calculates the temperature rise amount based on the reference temperature, a diameter of a supply pipe configured to connect the space to the gas supplier, and a gas supply amount of the gas supplier.

10. A method of manufacturing a device, said method comprising the steps of:
exposing a substrate to extreme ultraviolet light using an exposure apparatus defined in claim 1;
developing the exposed substrate; and
processing the developed substrate to manufacturing the device.

11. A method of manufacturing a device, the method comprising:
exposing a substrate to extreme ultraviolet light using an exposure apparatus having a vacuum chamber, and configured to illuminate a reticle using extreme ultraviolet light and expose a substrate to extreme ultraviolet light via the reticle in the vacuum chamber, said exposure apparatus comprising: a load lock chamber through which the substrate is fed from a first space in an atmospheric pressure to a second space in the vacuum chamber; a gas supplier configured to supply a gas to a third space in the load lock chamber so that a pressure in the third space changes from a pressure in the vacuum chamber to the atmospheric pressure; and a cooling unit configured to cool the gas so that the gas to be supplied to the third space has a first temperature, wherein the first temperature is previously determined based on a temperature rise amount of the gas supplied to the third space from the gas supplier, the first temperature being lower than a reference temperature, at which a temperature of the third space is to be maintained;
developing the exposed substrate; and
processing the developed substrate to manufacturing the device.

* * * * *